United States Patent [19]

Chang

[11] Patent Number: 5,985,752
[45] Date of Patent: Nov. 16, 1999

[54] SELF-ALIGNED VIA STRUCTURE AND METHOD OF MANUFACTURE

[75] Inventor: Ming-Lun Chang, Hsinchu, Taiwan

[73] Assignee: Winbond Electronics Corp., Hsinchu, Taiwan

[21] Appl. No.: 08/990,812

[22] Filed: Dec. 15, 1997

[30] Foreign Application Priority Data

Oct. 8, 1997 [TW] Taiwan ................................. 86114720

[51] Int. Cl.⁶ ............................................. H01L 21/4763
[52] U.S. Cl. .......................... 438/637; 438/641; 438/669
[58] Field of Search .................................. 438/637, 641, 438/669

*Primary Examiner*—John F. Niebling
*Assistant Examiner*—David A. Zarneke

*Attorney, Agent, or Firm*—Rabin & Champagne, P.C.

[57] ABSTRACT

A self-aligned via structure and its method of manufacture comprising the steps of providing a semiconductor substrate, and then sequentially forming a conductive layer and a dielectric layer over the substrate. Next, a hollow cavity is etched out in the dielectric layer. Then, a photolithographic process is performed by coating a photoresist layer over the dielectric layer and the cavity, followed by creating a pattern of desired conductive lines so that portions of the photoresist layer overlaps with the cavity. Subsequently, using the photoresist layer as a mask, the dielectric layer and the conductive layer are etched to form a multiple of conductive lines. Thereafter, a selective liquid phase deposition is performed to deposit an oxide layer over the substrate in regions outside the photoresist-occupied regions. Finally, the photoresist layer is removed to form the via structure of this invention in the oxide layer.

16 Claims, 6 Drawing Sheets

SELF-ALIGNED VIA STRUCTURE AND METHOD OF MANUFACTURE

BACKGROUND OF THE INVENTION

1. Field of Invention

The present invention relates to a self-aligned via structure and the method for manufacturing the structure. More particularly, the present invention relates to a self-aligned via structure and its manufacturing method that can circumvent the restrictions imposed by the extension rules.

2. Description of Related Art

Integrated circuits are now developing towards more precise and complicated functions. As the feature size of a device gets smaller, the design rules for manufacturing such devices become more restrictive. To link up all the devices in the integrated circuit properly, sufficient metallic interconnects must be made on top of the wafer within the limited surface area available. To produce sufficient interconnections, the current trend is to form two or more metallic layers each separated by dielectric layers, then interconnecting different metallic layers through vias.

FIG. 1 is a top view showing a layout of a conventional via structure. In FIG. 1, several vias 11 are distributed on a dielectric layer 10, and the conductive lines 12 (shown by the dash lines) are formed below the dielectric layer 10. The conductive lines 12 are connected electrically to a metallic layer (not shown) on top of the dielectric layer 10 through vias 11. For a conventional via structure 11 design, the extension rules must be referred to. The so-called extension rules are additional dimensions added on to the feature dimensions when the layout of an electric circuit is first planned as to provide enough dimensional tolerance for possible errors arising from various factors in production. For example, it is difficult to make a via align perfectly with the metallic layer below. Therefore, a tolerance within the range of about ±0.15 μm must be allowed, for example. Another factor concerns the dimensional bias produced by production equipment. For example, the actual size of the via 11 that comes out from a light exposure may be quite different from the desired via dimensions. Therefore, it is a normal practice to allow a tolerance range, for example, about ±0.21 μm, for taking into account the errors produced by the equipment in the production process. As shown in FIG. 1, a tolerance width of d is used around the via 11.

In the conventional production method of vias, whenever some defects are encountered, extension rules are added to the device layout such as a value d in FIG. 1. Such spatial consideration has the impact of severely limiting further miniaturization of the devices. Furthermore, one of the steps in the production of a via is to go through a light exposure step, and light passing through the optical system will undergo diffraction. Therefore, the original shape of the via will be slightly distorted. For example, the corners of the via will be more rounded. The occurrence of such rounding will reduce the actual size of the via, increase etching difficulties and increase the resistance of the via. Alternately, when alignment is carried out, misalignment can occur quite easily, thereby also leading to an increase in the resistance of via and difficulties in etching.

In light of the foregoing, there is a need in the art to provide a better method for forming a via.

SUMMARY OF THE INVENTION

Accordingly, the present invention is directed to provide a self-aligned via structure and method of manufacture utilizing a self-aligning method which is capable of avoiding the conventional photolithographic and etching steps. Therefore, the via structure is not restricted by the extension rules, thereby serving to speed up the development of device miniaturization. In addition, difficulties in etching caused by rounding of via corners and the increase in via resistance can be minimized.

To achieve these and other advantages and in accordance with the purpose of the invention, as embodied and broadly described herein, the invention provides a self-aligned via structure and its method of manufacture. The method comprises the steps of providing a semiconductor substrate, and then sequentially forming a conductive layer and a dielectric layer over the substrate. Next, a hollow cavity is etched out in the dielectric layer. Then, a photolithographic process is performed by coating a photoresist layer over the dielectric layer and the cavity, followed by creating a pattern of the desired conductive lines so that portions of the photoresist layer overlaps with the cavity. Subsequently, using the photoresist layer as a mask, the dielectric layer and the conductive layer are etched to form a multiple of conductive lines. Thereafter, a selective liquid phase deposition is performed to deposit an oxide layer over the substrate in regions outside the photoresist-occupied regions. Finally, the photoresist layer is removed to form a via in the oxide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3a through 8a are top views showing the progression of manufacturing steps in the production of a via structure according to the first preferred embodiment of this invention;

FIGS. 3b through 6b are perspective views of FIGS. 3a through 6a respectively;

FIGS. 7b and 8b are cross-sectional views along line AA' of FIGS. 7a and 8a respectively;

FIGS. 9a through 16a are top views showing the progression of manufacturing steps in the production of a via structure according to the second preferred embodiment of this invention;

FIGS. 9b through 12b are perspective views of FIGS. 9a through 12a respectively; and FIGS. 13b through 16b are cross-sectional views along line BB' of FIGS. 13a through 16a respectively.

DESCRIPTION OF THE PREFERRED EMBODIMENTS

Figure 1:
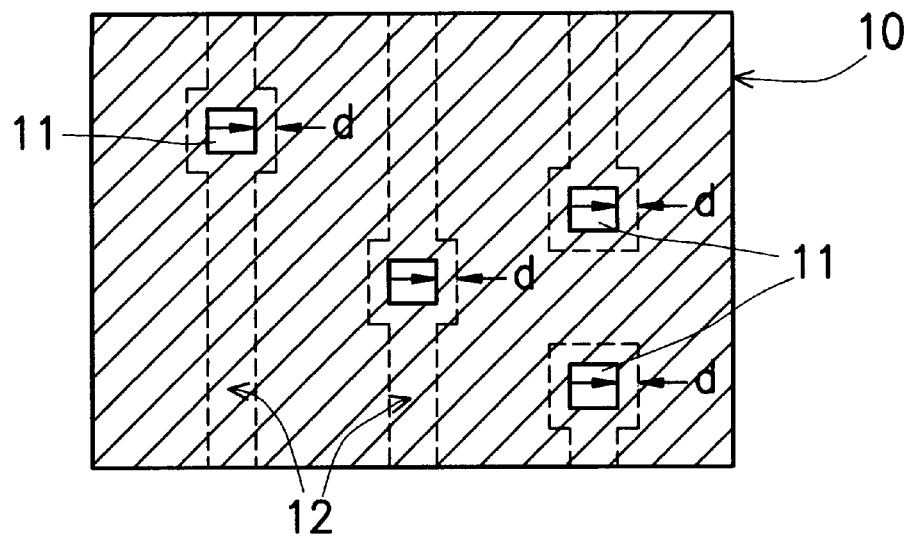
FIG. 1 is a top view showing a layout of a conventional via structure.

Reference will now be made in detail to the present preferred embodiments of the invention, examples of which are illustrated in the accompanying drawings. Wherever possible, the same reference numbers are used in the drawings and the description to refer to the same or like parts.

This invention uses a self-aligned method in the production of vias, and so the conventional photolithographic and etching steps are no longer needed. Therefore, problems caused by the misalignment of via are eliminated, and considerations for the extension rules can be lifted. Furthermore, the dimensions of the vias will be unaffected by the optical systems used in the production, and a lower resistance will be obtained for the vias. Hence, the invention provides a step towards future device miniaturization.

Figure 2:
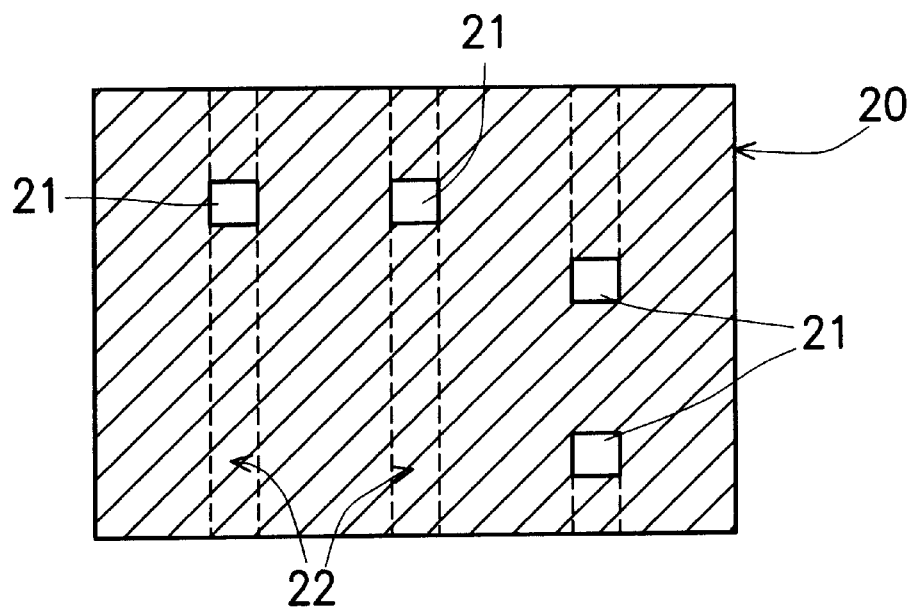
FIG. 2 is a top view showing a layout of a via structure according to a first preferred embodiment of this invention.
Figure 3:
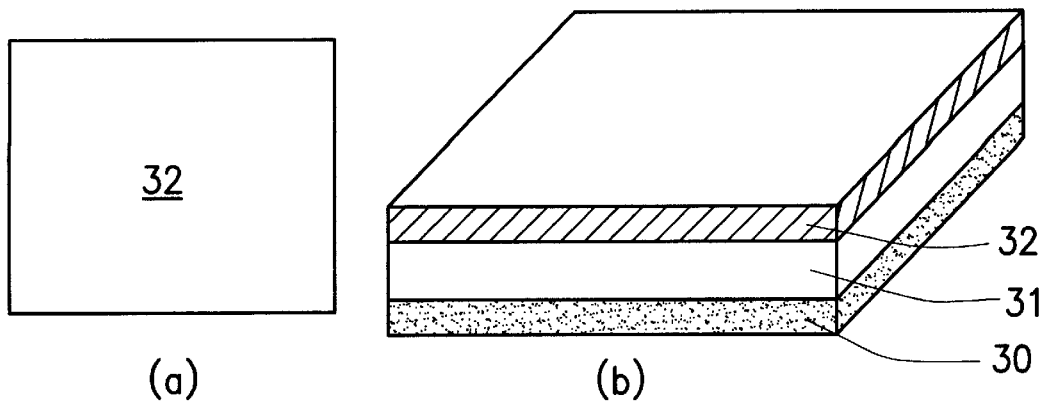
Figure 4:
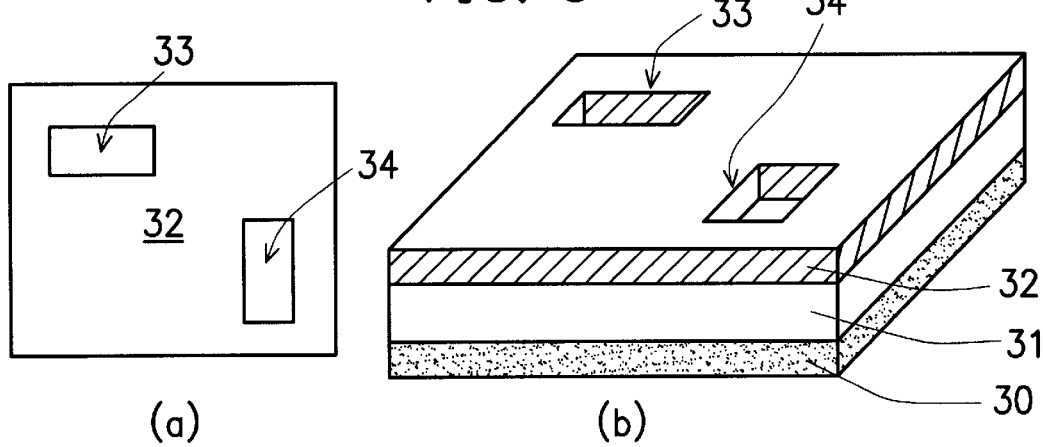
Figure 5:
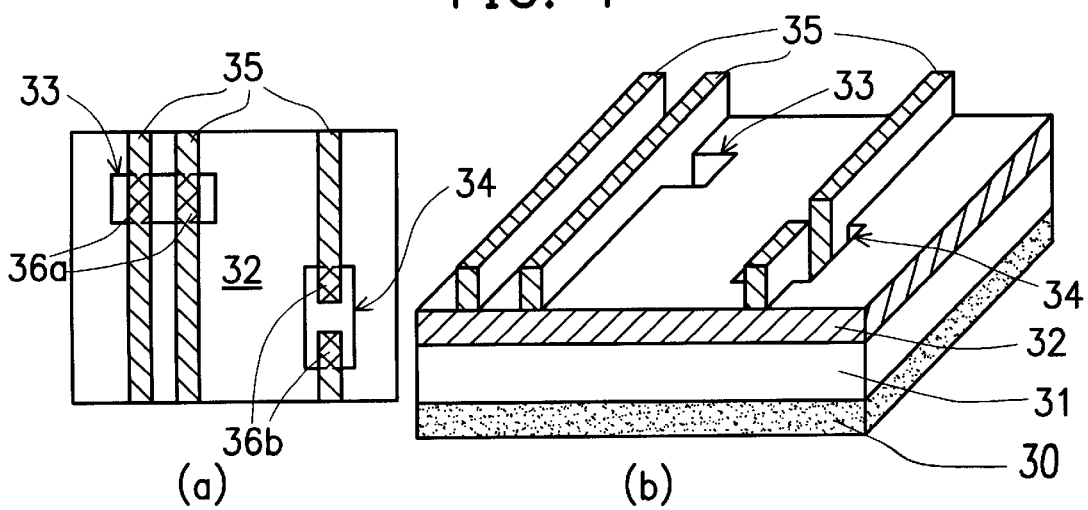
Figure 6:
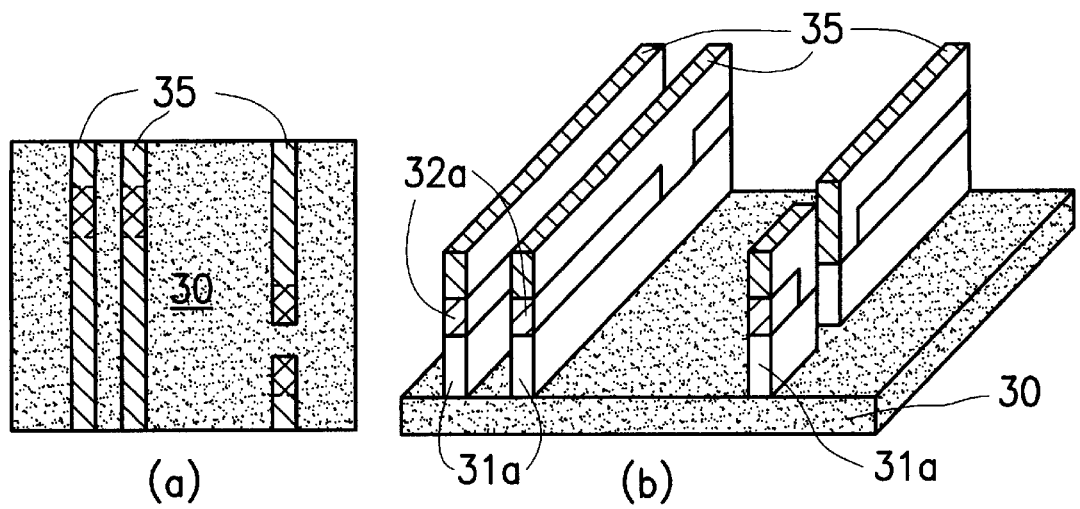

FIG. 2 is a top view showing a layout of a via structure according to a first preferred embodiment of this invention. As shown in FIG. 2, a number of vias 21 are distributed in the dielectric layer 20. Underneath the dielectric layer 20 are a number of conductive lines 22 (shown in dashed lines), which are connected electrically to a metallic layer (not shown) through vias 21. Comparing this via structure 21 with the conventional via structure 11 (as shown in FIG. 1), the via structure 21 here do not need to consider the extension rules, nor has to allow an extra width d around the via 21. Therefore, space occupied by the devices can be greatly reduced, and the level of integration in wafers can be greatly increased.

Figure 7:
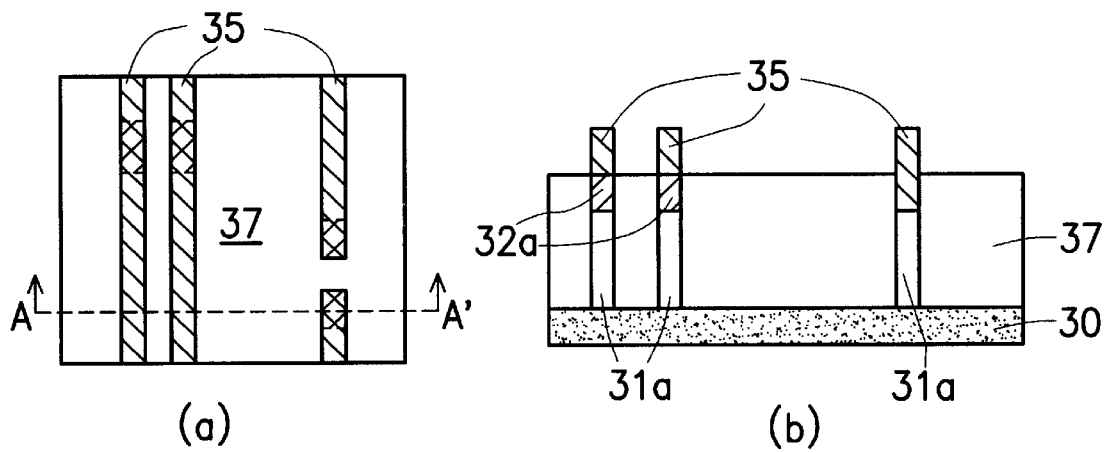
Figure 8:
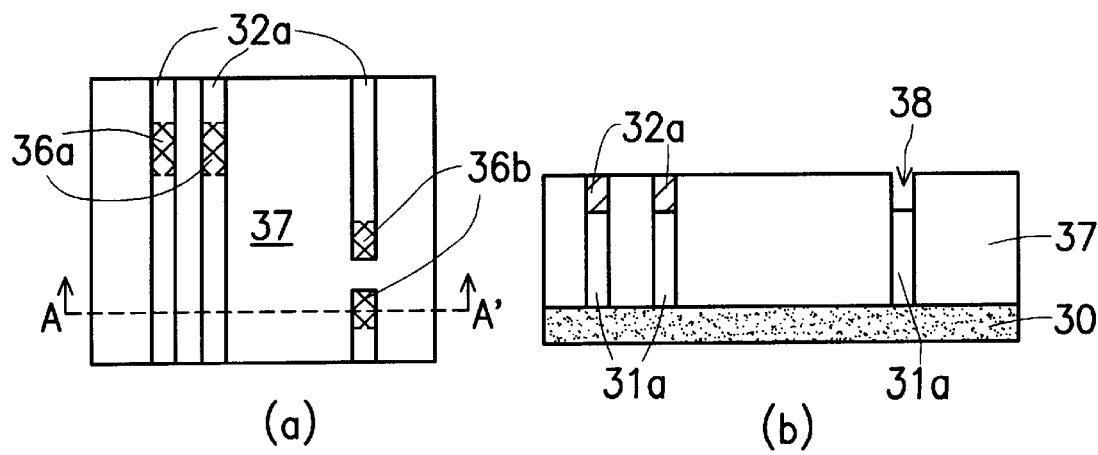
Figure 9:
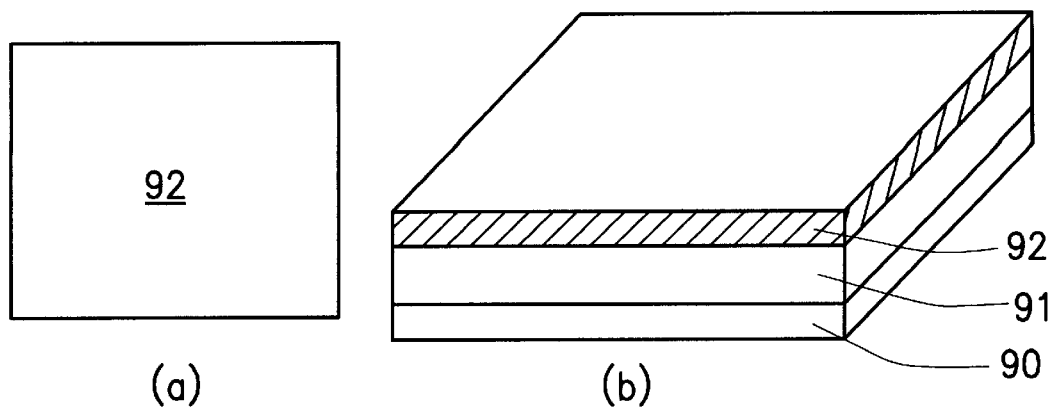
Figure 10:
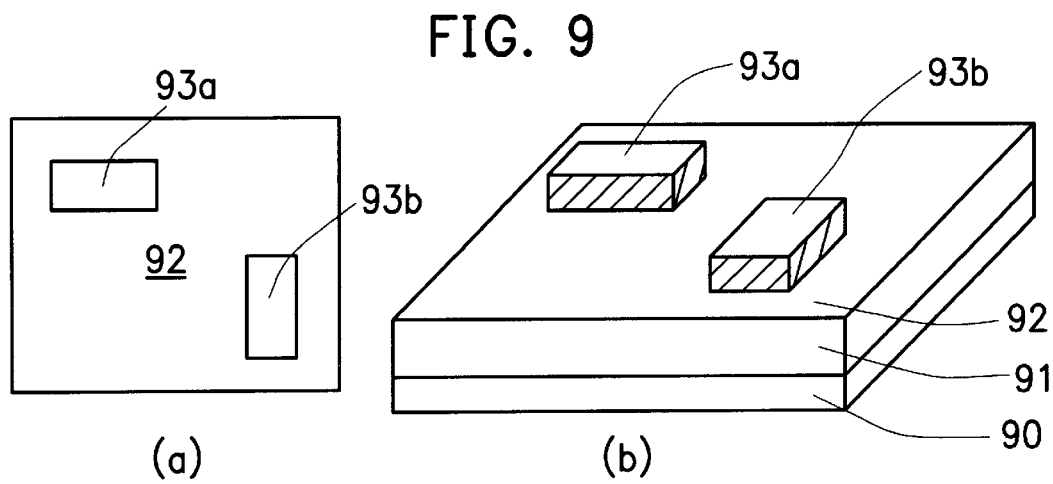
Figure 11:
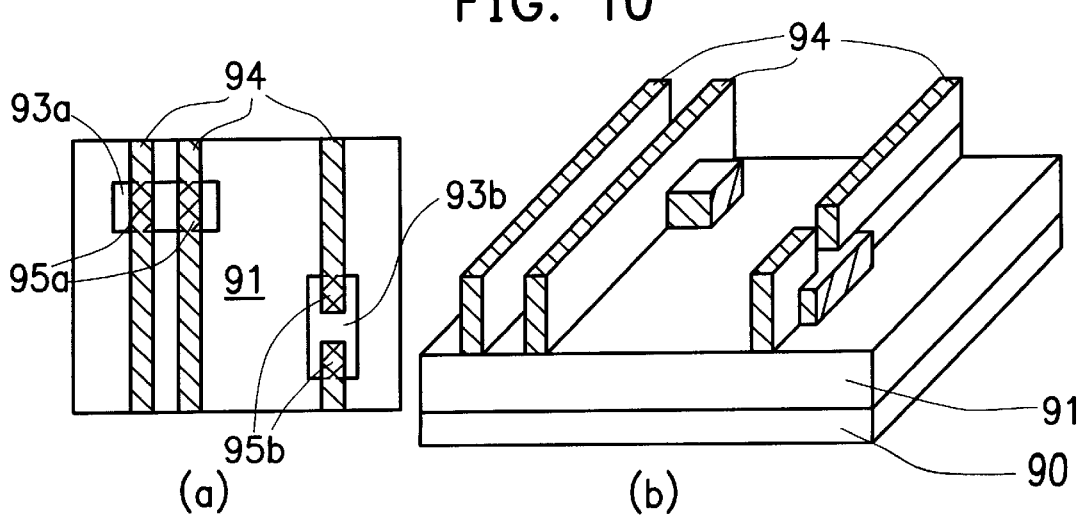
Figure 12:
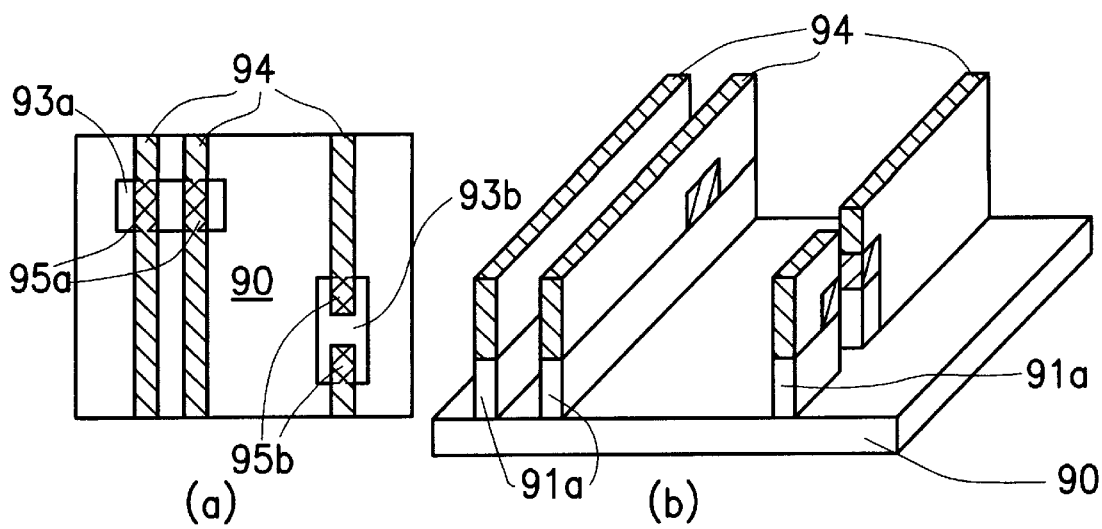
Figure 13:
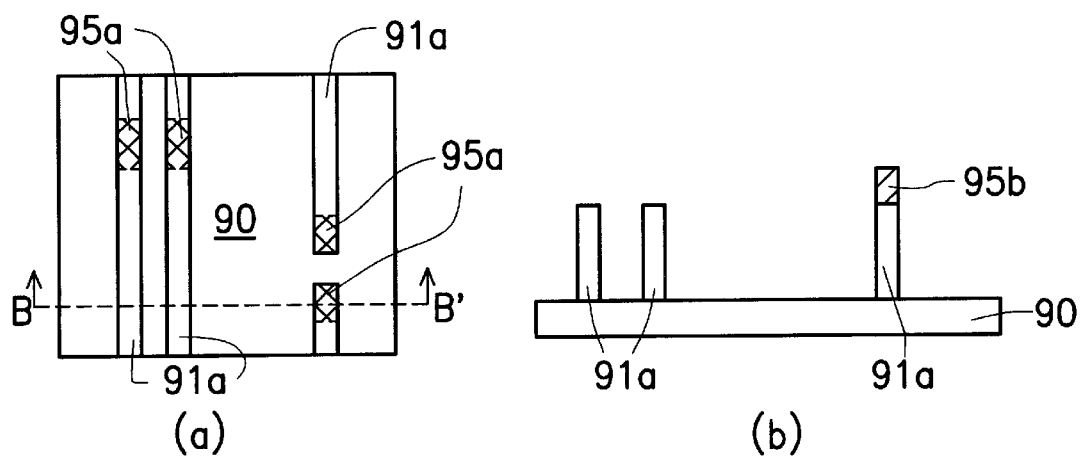
Figure 14:
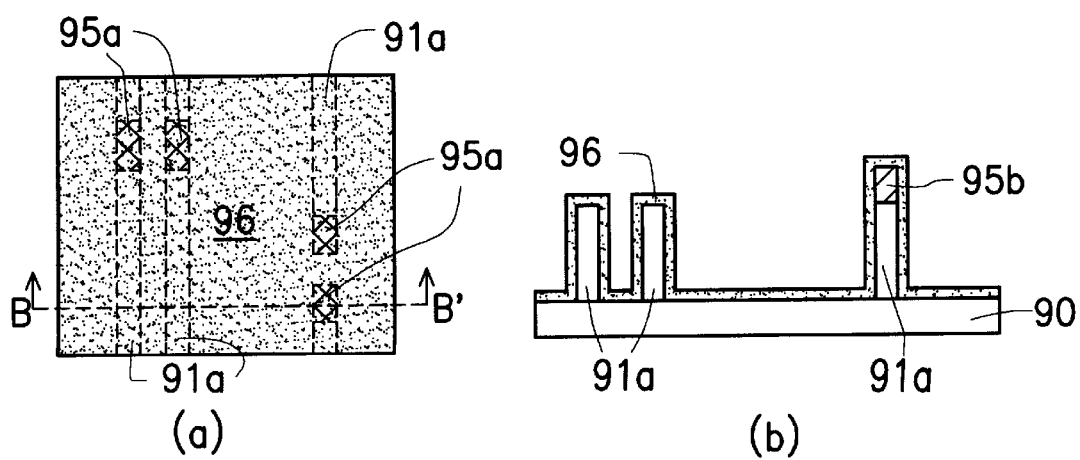
Figure 15:
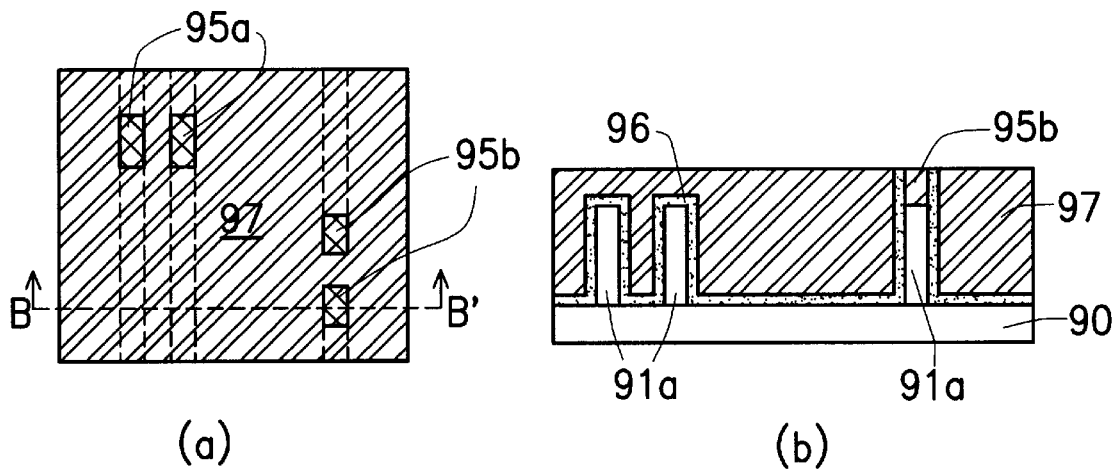
Figure 16:
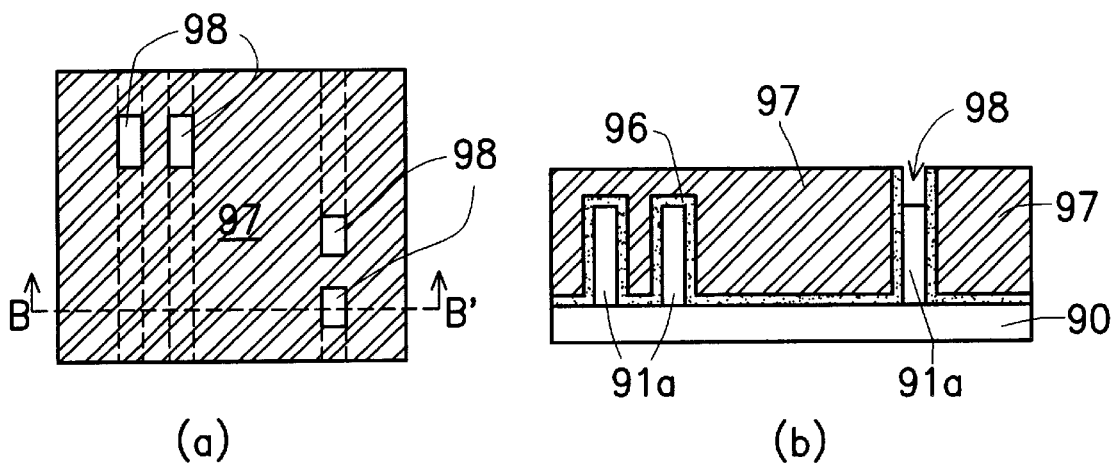

FIGS. 3a through 8a are top views showing the progression of manufacturing steps in the production of a via structure according to the first preferred embodiment of this invention, FIGS. 3b through 6b are perspective views of FIGS. 3a through 6a respectively; and FIGS. 7b and 8b are cross-sectional views along line AA' of FIGS. 7a and 8a respectively.

First, as shown in FIGS. 3a and 3b, a semiconductor substrate 30 is provided, then a conductive layer 31 is formed over the substrate. Next, a dielectric layer 32 is formed over the conductive layer 31. The dielectric layer 32 is formed by depositing silicon nitride or an oxide using a chemical vapor deposition method, and the thickness is preferably between 500 Å to 2000 Å.

Next, as shown in FIGS. 4a and 4b, hollow cavities are etched in the dielectric layer 32, for example, a first cavity 33 and a second cavity 34. The length and width of the each cavity are determined by the size of the via and the desired conductive lines. For example, the length of the first cavity 33 is about (2×desired width of the conductive line+desired distance between two conductive lines +0.1~0.2 μm), and its width is about the same as the desired width of the via; the length of the second cavity 34 is about (desired width of the via+0.1~0.2 μm) and its width is about (2×desired width of the via+desired distance between two conductive lines); and here, 0.1~0.2 μm is the necessary tolerance.

Next, as shown in FIGS. 5a and 5b, photolithographic processing is performed by forming a photoresist layer 35 over the dielectric layer 32, the first cavity 33 and the second cavity 34. Then, the photoresist layer 35 is patterned such that the photoresist layer 35 forms an overlapping region 36a with the first cavity 33, and the photoresist layer 35 forms another overlapping region 36b with the second cavity 34.

Next, as shown in FIGS. 6a and 6b, the dielectric layer 32 is then etched in a first etching operation using the photoresist layer 35 as a mask. Then, the conductive layer 31 is etched in a second etching operation also using the photoresist layer 35 as a mask to expose the substrate 30 and forming conductive lines 31a and dielectric lines 32a.

Next, as shown in FIGS. 7a and 7b, a selective liquid phase deposition (LPD) is performed to deposit an oxide layer 37 over the substrate 30. The deposited oxide layer is preferably silicon dioxide, and the LPD is carried out at about 35° C. Because the liquid phase deposition will selectively deposit oxide on silicon dioxide layers, and not on other materials, for example, photoresist material, the oxide will form in the region above the substrate away from the photoresist layer.

Next, as shown in FIGS. 8a and 8b, the photoresist layer 35 is removed to form via structures 38 of this invention at the former overlapping locations 36a or 36b. The oxide layer 37 and the dielectric layer 32a form the insulating layer surrounding the conductive lines 31a. The vias 38 formed here is not restricted by any extension rules. Furthermore, because the vias 38 are formed at the overlapping locations 36a or 36b, size of the vias 38 are determined only by the first cavity 33 (or the second cavity 34) and the conductive lines 31a. Therefore, the via alignment and photolithographic exposure problems of a convention method can be completely avoided.

FIGS. 9a through 16a are top views showing the progression of manufacturing steps in the production of a via structure according to the second preferred embodiment of this invention; FIGS. 9b through 12b are perspective views of FIGS. 9a through 12a respectively, and FIGS. 13b through 16b are cross-sectional views along line BB' of FIGS. 13a through 16a respectively.

First, as shown in FIGS. 9a and 9b, a semiconductor substrate 90 is provided, then a conductive layer 91 is formed over the substrate. Next, a dielectric layer 92 is formed over the conductive layer 91. The dielectric layer 92 can be, for example, a silicon nitride layer having a thickness preferably between 500 Å to 2000 Å.

Next, as shown in FIGS. 10a and 10b, a first etching operation is perform to etch the dielectric layer 92 forming a first protruding pad 93a and a second protruding pad 93b, for example. The length and width of the protruding pads are determined by the size of the via and the desired conductive lines. For example, the length of the first protruding pad 93a is about (2×desired width of the conductive line+desired distance between two conductive lines+0.1~0.2 μm), and its width is about the same as the desired width of the via, the length of the second protruding pad 93b is about (desired width of the via+0.1~0.2 μm) and its width is about (2×desired width of the via+desired distance between two conductive lines).

Next, as shown in FIGS. 11a and 11b, photolithographic processing is performed by forming a photoresist layer 94 over the dielectric layer 92, the first protruding pad 93a and the second protruding pad 93b. Then, the photoresist layer 94 is patterned such that portions of the photoresist layer 94 forms overlaps 95a with the first protruding pad 93a, and the photoresist layer 94 forms another overlaps 95b with the second protruding pad 93b.

Next, as shown in FIGS. 12a and 12b, using the photoresist layer 94 as a mask, the conductive layer 91 is etched to form conductive lines 91a in a second etching operation.

Next, as shown in FIGS. 13a and 13b, the photoresist layer 94 is removed, and in FIGS. 14a and 14b, a thin first insulating layer 96 is deposited over the substrate 90. The first insulating layer 96, for example, can be an undoped TEOS layer formed using a chemical vapor deposition method with tetraethyl orthosilicate (TEOS) as the reactive gas.

Next, as shown in FIGS. 15a and 15b, a second insulating layer 97 is formed over the first insulating layer 96. The second insulating layer 97 can be an oxide layer, for example. Subsequently, portions of the second insulating layer 97 are removed to expose surfaces of the first protruding pad 93a and the second protruding pad 93b. The second insulating layer 97 can be removed using an etching back method or a chemical-mechanical polishing (CMP) method.

Next, as shown in FIGS. 16a and 16b, the first protruding pad 93a at the original overlapping locations 95a and the second protruding pad 93b at the original overlapping locations 95b are removed using a selective etching method. Thus, the via structures 98 of this invention are formed at the former overlapping locations 95a and 95b, whose sidewalls are the first insulating layer 96. The vias 98 formed here is not restricted by any extension rules. Furthermore, because the vias 98 are formed at the overlapping locations 95a or 95b, size of the vias 98 are determined only by the first protruding pad 93a (or the second protruding pad 93b) and the conductive lines 91a. Therefore, the via alignment and photolithographic exposure problems of a convention method can be avoided.

As a summary, the self-aligned via structure provided by this invention includes the following advantages (1) No photolithographic and etching operations are used in forming the via structure of this invention. Therefore, there is no need to consider via misalignment problems and the extension rules. In addition, resistance of the via is lower and the devices can be further miniaturized, thus raising the level of integration.

(2) There is no rounding of corners for the vias and production is not limited by the optical processing. Therefore, this invention provides impetus for future miniaturization.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a self-aligned via structure that does not have extension rule restrictions, comprising the steps of:

providing a semiconductor substrate having a conductive layer and a dielectric layer already formed thereon;

etching out a hollow cavity in the dielectric layer;

performing a photolithographic operation by first forming a photoresist layer over the dielectric layer and the cavity, then creating a pattern on the photoresist layer such that portions of the photoresist layer forms an overlap with the cavity, wherein the overlap corresponds to the position where the desired via is located;

etching the dielectric layer and the conductive layer to form a plurality of conductive lines using the photoresist layer as a mask;

performing a selective liquid phase deposition to form a layer of oxide over the substrate, and the oxide layer occupies regions outside the photoresist-occupied regions; and removing the photoresist layer to form an opening in the oxide layer, wherein the opening is the via structure that corresponds to the overlapping locations.

2. The method of claim 1, wherein the step of forming the dielectric layer including depositing silicon nitride.

3. The method of claim 1, wherein the thickness of the deposited dielectric layer is preferably between 500 Å to 2000 Å.

4. The method of claim 1, wherein the length of the cavity is about (2×width of the conductive line+distance between two conductive lines+0.1~0.2 µm), and the width of the cavity is about the same as the width of the via.

5. The method of claim 1, wherein the length of the cavity is about (the width of the via+0.1~0.2 µm), and the width of the cavity is about (2×the width of the via+distance between two conductive lines).

6. The method of claim 1, wherein the step of forming the oxide layer includes depositing silicon dioxide at a temperature of about 35° C.

7. The method of claim 1, wherein the overlapping locations are the places for forming the vias such that the size of a via is determined by the cavity and the conductive line, and hence able to avoid via aligning and photolithographic exposure problems.

8. A method for forming self-aligned via structure that does not have the extension rule restrictions, comprising the steps of:

providing a semiconductor substrate having a conductive layer already formed thereon;

forming a dielectric layer over the conductive layer;

performing a first etching operation to etch the dielectric layer into a protruding pad;

performing a photolithographic operation by forming a photoresist layer over the dielectric layer and the protruding pad, then patterning the photoresist layer such that portions of the photoresist layer forms overlaps with the protruding pad;

performing a second etching operation to etch the conductive layer forming a plurality of conductive lines using the photoresist layer as a mask;

removing the photoresist layer;

forming a thin first insulating layer over the substrate;

forming a second insulating layer over the first insulating layer;

removing a top portion of the second insulating layer to expose the protruding pad surface; and removing the protruding pad to form the via structure.

9. The method of claim 8, wherein the step of forming the dielectric layer including depositing silicon nitride.

10. The method of claim 8, wherein the thickness of the deposited dielectric layer is preferably between 500 Å to 2000 Å.

11. The method of claim 8, wherein the length of the protruding pad is about (2×width of the conductive line+distance between two conductive lines+0.1~0.2 µm), and the width of the protruding pad is about the same as the width of the via.

12. The method of claim 8, wherein the length of the protruding pad is about (the width of the via+0.1~0.2 µm), and the width of the protruding pad is about (2×the width of the via+distance between two conductive lines).

13. The method of claim 8, wherein the overlapping locations are the places for forming the vias such that the size of a via is determined by the protruding pad and the conductive line, and hence able to avoid via aligning and photolithographic exposure problems.

14. The method of claim 8, wherein the step of forming the first insulating layer includes depositing undoped TEOS.

15. The method of claim 8, wherein the step of removing a portion of the second insulating layer includes using an etching back method.

16. The method of claim 8, wherein the step of removing a portion of the second insulating layer includes using a chemical-mechanical polishing method.

* * * * *